United States Patent
Mori et al.

(10) Patent No.: US 6,753,070 B2
(45) Date of Patent: *Jun. 22, 2004

(54) INSULATING CERAMIC COMPACT, CERAMIC MULTILAYER SUBSTRATE, AND CERAMIC ELECTRONIC DEVICE

(75) Inventors: Naoya Mori, Omihachiman (JP);
Yasutaka Sugimoto, Kyoto (JP);
Osamu Chikagawa, Moriyama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 109 days.

This patent is subject to a terminal disclaimer.

(21) Appl. No.: 09/902,949

(22) Filed: Jul. 11, 2001

(65) Prior Publication Data

US 2002/0030573 A1 Mar. 14, 2002

(30) Foreign Application Priority Data

Jul. 21, 2000 (JP) ......................................... 2000-220867

(51) Int. Cl.[7] .............................................. B32B 18/00
(52) U.S. Cl. ...................... 428/209; 428/901; 428/137; 428/138; 501/5; 501/6; 501/9; 501/10; 501/32; 336/73; 174/255
(58) Field of Search ................................ 428/901, 209; 428/137, 138; 501/5, 6, 9, 10, 32; 336/73; 174/255

(56) References Cited

U.S. PATENT DOCUMENTS

| 6,121,173 | A  | * | 9/2000  | Terashi ........................... 501/4 |
| 6,201,307 | B1 | * | 3/2001  | Terashi et al. ............... 257/784 |
| 6,403,199 | B2 | * | 6/2002  | Mori et al. .................. 428/209 |
| 6,403,200 | B2 | * | 6/2002  | Chikagawa et al. ......... 428/209 |
| 6,413,620 | B1 | * | 7/2002  | Kimura et al. ............... 428/210 |
| 6,455,453 | B1 | * | 9/2002  | Chikagawa .................. 501/120 |
| 2002/0027018 | A1 | * | 3/2002 | Chikagawa et al. ......... 174/255 |
| 2002/0030573 | A1 | * | 3/2002 | Mori et al. .................... 336/73 |

FOREIGN PATENT DOCUMENTS

| GB | 2360036    | 9/2001 |
| JP | 05-238774  | 9/1993 |
| JP | 08-034668  | 2/1996 |
| JP | 09-208298  | 8/1997 |

* cited by examiner

*Primary Examiner*—William P. Watkins, III
(74) *Attorney, Agent, or Firm*—Dickstein, Shapiro, Morin & Oshinsky, LLP.

(57) ABSTRACT

An insulating ceramic compact is provided which can be obtained by low-temperature firing, has a low relative dielectric constant and superior high frequency characteristics, and can be co-sintered with a material having a high coefficient of thermal expansion. The insulating ceramic compact is a fired mixture of an $MgAl_2O_4$-based ceramic and a borosilicate glass, in which an $MgAl_2O_4$ crystal phase and at least one of an $Mg_3B_2O_6$ crystal phase and an $Mg_2B_2O_5$ crystal phase are precipitated as primary crystal phases.

20 Claims, 7 Drawing Sheets

INSULATING CERAMIC COMPACT, CERAMIC MULTILAYER SUBSTRATE, AND CERAMIC ELECTRONIC DEVICE

BACKGROUND OF THE INVENTION

1. Field of the Invention

The present invention relates to insulating ceramic compacts for use in multilayer circuit substrates, and more particularly, relates to a high-frequency insulating ceramic compact which is suitably used for a hybrid multilayer circuit substrate for mounting semiconductor elements or various electronic elements thereon and which can be simultaneously fired with a conductive material such as copper or silver, relates to a ceramic multilayer substrate using the insulating ceramic compact and relates to a ceramic electronic device.

2. Description of the Related Art

In recent years, trends toward high speed and high frequency processing of electronic devices have been progressing rapidly. In addition, electronic elements mounted on electronic devices are required to satisfy a higher processing speed and a higher integration density and furthermore, are also required to satisfy a higher mounting density. In response to the requirements described above, multilayer circuit substrates have been used as substrates for mounting semiconductor elements and various electronic elements thereon. In multilayer circuit substrates, conductor circuits or functional electronic elements are embedded, and hence, miniaturization of electronic devices can be performed.

As a material for forming the multilayer circuit substrate described above, alumina has heretofore been used in many cases.

The firing temperature for alumina is relatively high, such as 1,500 to 1,600° C. Accordingly, a high melting point metal, such as molybdenum (Mo), molybdenum-manganese (Mo—Mn), tungsten (W) or the like, must be generally used as a material for a conductive circuit embedded in the multilayer circuit substrate composed of alumina. However, these high melting point metals have high electrical resistance.

Accordingly, it has been strongly desired that an inexpensive metal, such as copper, having a lower resistance than that of the high melting point metals be used as a conductive material. In order to use copper as the conductive material, usage of a glass ceramic or a crystallized glass, which can be fired at 1,000° C. or less, is proposed (for example, Japanese Unexamined Patent Application Publication No. 5-238774).

In addition and in consideration of connection with a semiconductor element such as a silicon (Si) chip, usage of a ceramic having a coefficient of thermal expansion approximately equivalent to that of Si is proposed as a material for a multilayer circuit substrate (Japanese Unexamined Patent Application Publication No. 8-34668).

However, the known substrate materials described above, which can be fired at a low temperature, have problems in that the mechanical strength is low, the Q value is low and the types of the precipitated crystalline phases and the ratio thereof are easily influenced by the firing process.

In addition, the substrate materials disclosed in Japanese Unexamined Patent Application Publications Nos. 5-238774 and 8-34668 have a problem in that co-firing with a high dielectric material having a high coefficient of thermal expansion is difficult to perform.

SUMMARY OF THE INVENTION

Accordingly, an object of the present invention is to provide an insulating ceramic compact which can solve the problems of the conventional techniques described above, can be fired at a low temperature, can be simultaneously fired with a conductive material having a relatively low melting point, such as silver or copper, has a low relative dielectric constant and superior high-frequency characteristics, and in addition, has a high coefficient of thermal expansion.

Another object of the present invention is to provide a ceramic multilayer substrate which is formed of the insulating ceramic compact described above, can be fired at a low temperature, has a low relative dielectric constant and superior high-frequency characteristics and can be obtained by co-sintering with a high dielectric material having a high coefficient of thermal expansion, and is to provide a ceramic electronic device and a laminated ceramic electronic device which use the ceramic multilayer substrate described above.

Through intensive research by the inventors of the present invention in order to solve the problems described above, it was discovered that, in an insulating ceramic compact formed of a fired mixture of an $MgAl_2O_4$-based ceramic and a borosilicate glass, when an $MgAl_2O_4$ crystal phase and at least one of an $Mg_3B_2O_6$ crystal phase and an $Mg_2B_2O_5$ crystal phase are precipitated as primary crystal phases, or when an $MgAl_2O_4$ crystal phase, an $Mg_2SiO_4$ crystal phase and at least one of an $Mg_3B_2O_6$ crystal phase and an $Mg_2B_2O_5$ crystal phase are precipitated as primary crystal phases, an insulating ceramic compact can be obtained having a low relative dielectric constant, superior high frequency characteristics and a high coefficient of thermal expansion, whereby the present invention was made.

In accordance with one aspect of the present invention, an insulating ceramic compact is provided comprising a fired mixture of an $MgAl_2O_4$-based ceramic and a borosilicate glass, in which an $MgAl_2O_4$ crystal phase and at least one of an $Mg_3B_2O_6$ crystal phase and an $Mg_2B_2O_5$ crystal phase are precipitated as primary crystal phases.

In accordance with another aspect of the present invention, an insulating ceramic compact is provided comprising a fired mixture of an $MgAl_2O_4$-based ceramic and a borosilicate glass, in which an $MgAl_2O_4$ crystal phase, an $Mg_2SiO_4$ crystal phase, and at least one of an $Mg_3B_2O_6$ crystal phase and an $Mg_2B_2O_5$ crystal phase are precipitated as primary crystal phases.

In the present invention, the borosilicate glass preferably comprises boron oxide, silicon oxide and magnesium oxide. When an $MgAl_2O_4$ ceramic and a glass composition containing at least boron oxide ($B_2O_3$), silicon oxide ($SiO_2$) and magnesium oxide (MgO) are combined together, the $MgAl_2O_4$ crystal phase and at least one of the $Mg_3B_2O_6$ crystal phase and the $Mg_2B_2O_5$ crystal phase can be precipitated as the primary crystal phases, or the $MgAl_2O_4$ crystal phase and at least one of the $Mg_2SiO_4$ crystal phase, the $Mg_3B_2O_6$ crystal phase, and the $Mg_2B_2O_5$ crystal phase can be precipitated as the primary crystal phases, whereby, in both cases, an insulating ceramic compact can be obtained having superior high frequency characteristics and a high coefficient of thermal expansion.

The borosilicate glass preferably comprises about 8 to 60 wt % of boron oxide calculated as $B_2O_3$, about 10 to 50 wt % of silicon oxide as $SiO_2$ and about 10 to 55 wt % of magnesium oxide as MgO. In addition, the borosilicate glass more preferably comprises about 20 to 40 wt % of boron oxide.

In the borosilicate glass, the boron oxide preferably occupies about 8 to 60 wt % in the form of $B_2O_3$. The boron oxide serves primarily as a fusing agent. When the content of boron oxide is less than about 8 wt % in the form of $B_2O_3$, the melting temperature may be excessively increased in some cases and when the content is more than about 60 wt %, the humidity resistance may be degraded in some cases.

The silicon oxide preferably occupies about 10 to 50 wt % in the form of $SiO_2$. In addition, the silicon oxide more preferably occupies about 13 to 38 wt %. When the content thereof is less than about 10 wt %, the chemical stability of the borosilicate glass tends to be decreased and when the content is more than about 50 wt %, the melting temperature of the glass may be increased in some cases.

The magnesium oxide preferably occupies about 10 to 55 wt % in the form of MgO. In addition, the magnesium oxide more preferably occupies about 35 to 53 wt %. MgO decreases a melting temperature when a glass is formed and is a constituent component of a crystal in the crystallized glass. In particular, an $MgO-B_2O_3$ compound shows a Qf value (product of the Q value and the frequency f) of tens of thousands GHz and is primarily responsible for realizing superior high frequency characteristics. When the content of MgO is less than about 10 wt %, the Q value may be decreased in some cases and when the content thereof is more than about 55 wt %, the precipitated amount of the crystal becomes excessive, and hence, the substrate strength may be decreased in some cases.

By adjusting the ratio of the magnesium oxide and the boron oxide, contained in the borosilicate glass, a $Mg_3B_2O_6$ crystal phase or a $Mg_2B_2O_5$ crystal phase can be selectively precipitated. That is, when the magnesium oxide exceeds the ratio MgO: $B_2O_3$=3:1 on a molar basis, the $Mg_3B_2O_6$ crystal phase can be precipitated. On the other hand, when the boron oxide is exceeds the ratio MgO: $B_2O_3$=3:1, the $Mg_2B_2O_5$ crystal phase can be selectively precipitated. When the ratio is approximately MgO: $B_2O_3$=3:1, the $Mg_3B_2O_6$ crystal phase and the $Mg_2B_2O_5$ crystal phase are both present.

The borosilicate glass described above preferably further comprises about 20 wt % or less of an alkali metal oxide. The alkali metal oxide serves to decrease the melting temperature during glass formation; however, when the content thereof is more than about 20 wt %, the Q value tends to decrease. As the alkali metal oxide described above, there may be mentioned $Na_2O$, $K_2O$, $Li_2O$ and the like. In addition, the sintering temperature can also be decreased. When the amount of the alkali metal oxide in the borosilicate glass is adjusted, the coefficient of thermal expansion can also be adjusted.

The borosilicate glass preferably further comprises about 30 wt % or less of zinc oxide calculated as ZnO. Zinc oxide serves to decrease a firing temperature. However, when the content of zinc oxide is more than about 30 wt %, the chemical stability of the glass may be decreased in some cases.

The borosilicate glass preferably comprises about 10 wt % or less of copper oxide in the form of CuO. Copper oxide serves to decrease a firing temperature; however, when the content thereof is more than about 10 wt %, the Q value may be degraded in some cases.

The borosilicate glass preferably further comprises about 20 wt % or less of aluminum oxide in the form of $Al_2O_3$. Aluminum oxide can improve chemical stability. However, when the content of aluminum oxide is more than about 20 wt %, a dense sintered body may not be obtained in some cases.

The ratio of the $MgAl_2O_4$-based ceramic to the borosilicate glass is preferably in the range of from about 20:80 to 80:20 on a weight basis. When the content ratio of the ceramic described above is less than about 20 wt %, the Q value tends to decrease and when the content ratio is more than about 80 wt %, by firing at a temperature of from 900 to 1,000° C., the obtained insulating ceramic compact may not be sufficiently densified in some cases.

In said one aspect of the present invention, when the total crystal phases are assumed to be 100 wt % in the sintered body described above, about 5 to 80 wt % of the $MgAl_2O_4$ crystal phase and about 5 to 70 wt % of the $Mg_3B_2O_6$ crystal phase and/or the $Mg_2B_2O_5$ crystal phase are preferably precipitated, respectively. In the ranges described above, high reliability, superior sintering characteristics, a sufficient mechanical strength and a high Q value can be obtained. When the ratio of the $MgAl_2O_4$ crystal phase is less than about 5 wt %, the strength of the insulating ceramic compact may be decreased in some cases and when the ratio thereof is more than about 80 wt %, densification may not be performed by sintering at 1,000° C. or less in some cases.

When the content of the $MgAl_2O_4$ crystal phase is less than about 5 wt %, the filler component is decreased and the amount of an expensive glass is increased, whereby the cost may be increased in some cases. When the content is more than about 80 wt %, densification may be difficult to perform at 1,000° C. or less. In addition, when the content of the $Mg_3B_2O_6$ crystal phase and/or the $Mg_2B_2O_5$ crystal phase is less than about 5 wt %, since the reaction between the magnesium oxide (MgO) and the boron oxide ($B_2O_3$) does not sufficiently proceed, the sintering characteristics and the reliability may be decreased, and the Q value may also be decreased in some cases. In order to precipitate about 70 wt % or more of the $Mg_3B_2O_6$ crystal phase and/or the $Mg_2B_2O_5$ crystal phase, the amount of an expensive glass must be increased, and as a result, the cost is increased.

In said another aspect of the present invention, when the total crystal phases are assumed to be 100 wt % in the sintered body described above, it is preferable that about 5 to 80 wt % of the $MgAl_2O_4$ crystal phase be precipitated, and that the $Mg_2SiO_4$ crystal phase and at least one of the $Mg_3B_2O_6$ crystal phase and the $Mg_2B_2O_5$ crystal phase be precipitated so that the total precipitated amount thereof is about 5 to 70 wt %. In the ranges described above, superior sintering characteristics, sufficient mechanical strength, superior high frequency characteristics and a high coefficient of thermal expansion can be obtained. When the content of the $MgAl_2O_4$ crystal phase is less than about 5 wt %, the mechanical strength may be decreased in some cases and when the content is more than about 80 wt %, densification may not be performed at 1,000° C. or less in some cases. When the total precipitated amount of the $Mg_2SiO_4$ crystal phase, the $Mg_3B_2O_6$ crystal phase and the $Mg_2B_2O_5$ crystal phase is less than about 5 wt %, since the reaction between the magnesium oxide (MgO) and the boron oxide ($B_2O_3$) does not sufficiently proceed, the sintering characteristics and the reliability may be decreased and the Q value may also be decreased in some cases. When the total precipitated amount is more than about 70 wt %, the amount of an expensive glass must be increased, and as a result, the cost is increased.

As the glass described above, a mixture obtained by calcining a glass composition at 700 to 1,000° C. may also be used.

According to the present invention, since the $MgAl_2O_4$ ceramic and the predetermined borosilicate glass described above are used, an insulating ceramic compact can be obtained which can be formed by co-sintering with a low melting point metal material such as copper or silver and which has a sufficient mechanical strength, superior high frequency characteristics and a high coefficient of thermal expansion.

In addition, the obtained insulating ceramic compact preferably has a Q value of 700 or more at a measurement frequency of 15 GHz. When the Q value is 700 or more at 15 GHz, the insulating ceramic compact is preferably used for a circuit substrate used in a high frequency region, for example, in a frequency region of 1 GHz or more.

A ceramic multilayer substrate according to the present invention comprises a ceramic board having insulating ceramic layers composed of an insulating ceramic compact of the present invention and a plurality of internal electrodes formed in the insulating ceramic layers of the ceramic board.

In the ceramic multilayer substrate of the present invention, on at least one surface of each of the insulating ceramic layers described above, a second ceramic layer having a dielectric constant higher than that of the insulating ceramic layers is preferably provide.

In the ceramic multilayer substrate of the present invention, the plurality of internal electrodes is preferably laminated to each other with at least a part of the insulating ceramic layers provided therebetween so as to form a laminated capacitor.

In the ceramic multilayer substrate of the present invention, the plurality of internal electrodes may comprise capacitor internal electrodes which are laminated to each other with at least a part of the insulating ceramic layers provided therebetween so as to form a laminated capacitor, and coil conductors which are connected to each other so as to form a laminated inductor. The capacitor is preferably provided on the second ceramic layer (for miniaturization and increased capacitance).

A ceramic electronic device of the present invention comprises the ceramic multilayer substrate of the present invention and at least one electronic element which is mounted on the ceramic multilayer substrate and which forms a circuit together with the plurality of internal electrodes.

The ceramic electronic device of the present invention preferably further comprises a cap which is fixed to the ceramic multilayer substrate so as to enclose the electronic-element. As the cap, a conductive cap is preferably used.

The ceramic electronic device of the present invention preferably further comprises a plurality of external electrodes formed only on the bottom surface of the ceramic multilayer substrate and a plurality of conductors provided in throughholes, which is electrically connected to the external electrodes and which is electrically connected to the internal electrodes or to the electronic element.

A laminated ceramic electronic device of the present invention comprises a sintered ceramic body composed of the insulating ceramic compact of the present invention, a plurality of internal electrodes disposed in the laminated ceramic body, and a plurality of external electrodes which are formed on outside surfaces of the sintered ceramic body and which are electrically connected to some of the internal electrodes.

In the laminated ceramic electronic device of the present invention, the plurality of internal electrodes is disposed so as to be laminated to each other with ceramic layers provided therebetween, and hence, a capacitor unit is formed.

In addition to the internal electrodes forming the capacitor unit described above, the plurality of internal electrode preferably further comprises a plurality of coil conductors connected to each other so as to form a laminated inductor unit.

DESCRIPTION OF THE PREFERRED EMBODIMENTS

Hereinafter particular examples of an insulating ceramic compact according to the present invention will first be described, and in addition, examples of structures of a ceramic multilayer substrate, a ceramic electronic device and a laminated ceramic electronic device will be described, whereby the present invention will become apparent.

Powdered $Mg(OH)_2$ and $Al_2O_3$ were prepared as starting powdered materials and were mixed so as to have a stoichiometric composition represented by $MgAl_2O_4$. After wet-mixing was performed for 16 hours followed by drying, the mixture thus formed was calcined at 1,350° C. for 2 hours and was then pulverized.

Next, the powdered ceramic composition thus formed and a glass having a composition shown in Table 1 was mixed so that about 20 to 80 wt % of the powdered ceramic composition is contained in the mixture as a ceramic component, and after an appropriate amount of a binder was added thereto, pelletizing was then performed. Subsequently, molding at a pressure of 200 MPa was performed, thereby forming a cylindrical molded body 7 mm thick and 12 mm in diameter. This molded body was fired at 850 to 1,000° C. for 2 hours in the air, thereby forming a sample of an insulating ceramic compact. By using the sample of this insulating ceramic compact thus formed, the relative dielectric constant and the Q value were measured at 15 GHz by a dielectric resonant method. The measurement results are shown in Table 2.

Figure 1:
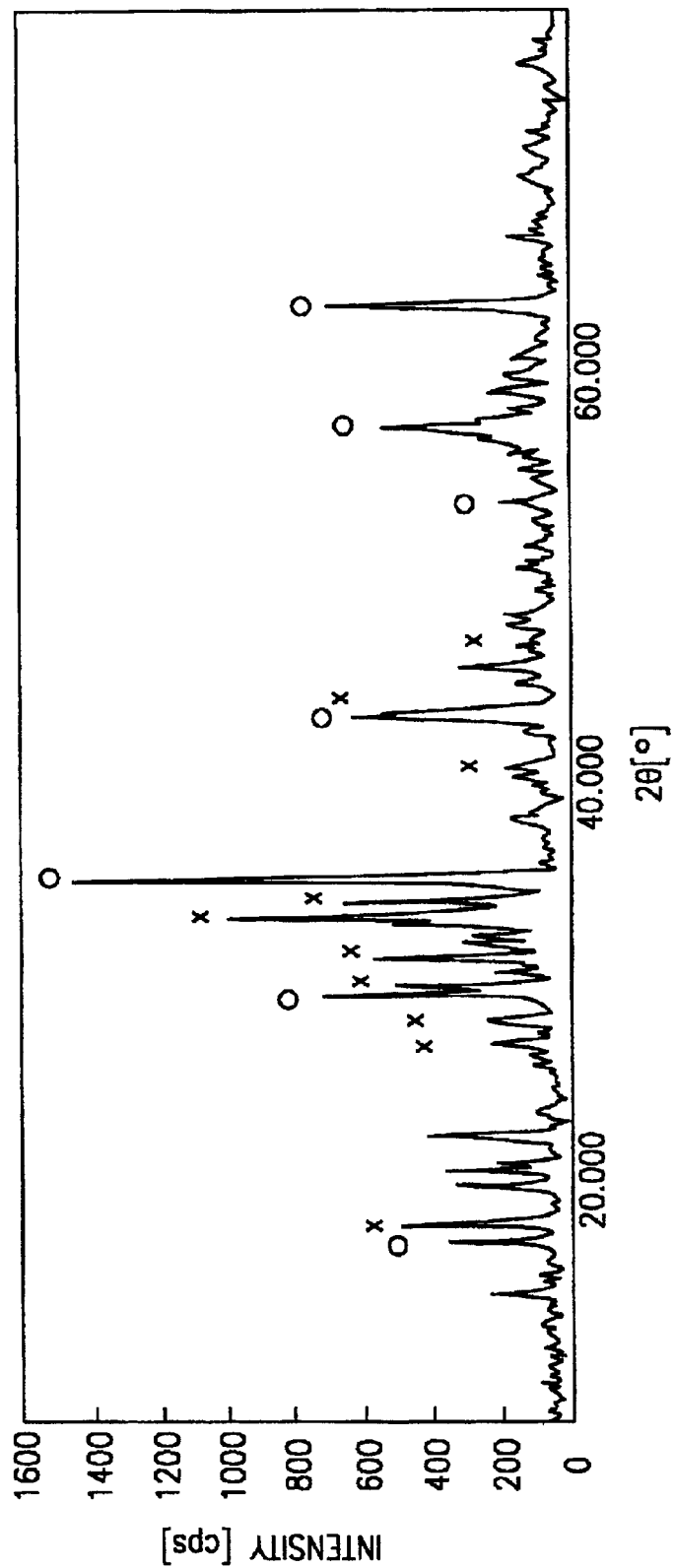
FIG. 1 is a view showing an XRD spectrum of an insulating ceramic compact of sample No. 9 according to an example of the present invention.
Figure 2:
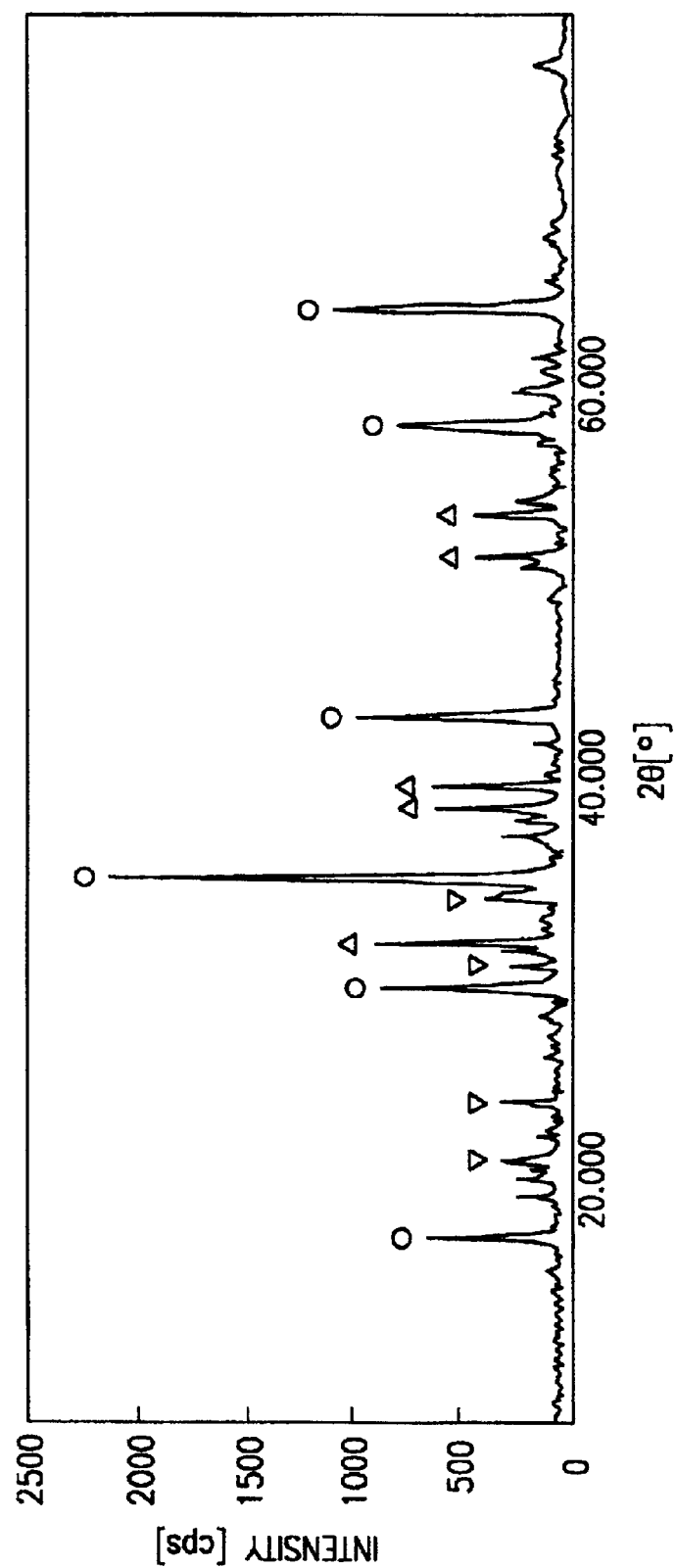
FIG. 2 is a view showing an XRD spectrum of an insulating ceramic compact of sample No. 14 according to an example of the present invention.
Figure 3:
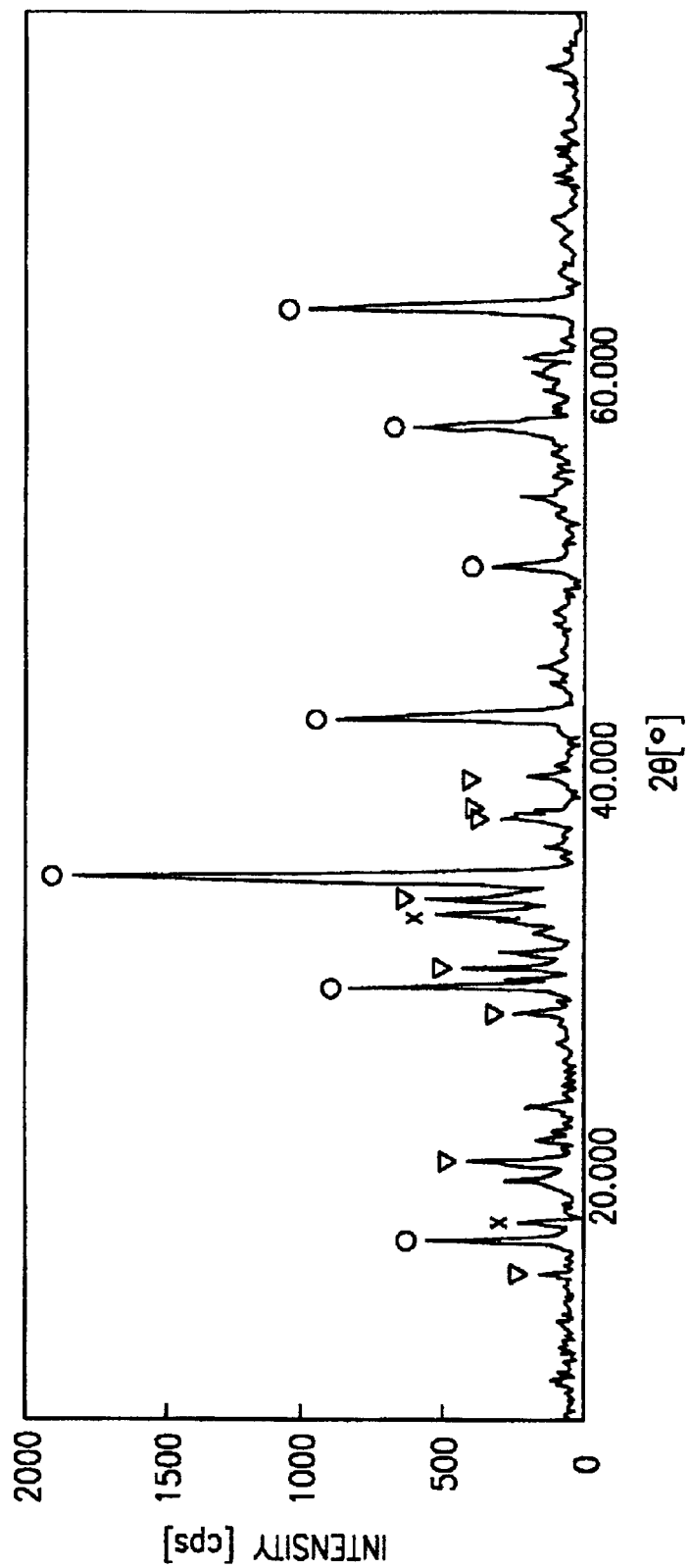
FIG. 3 is a view showing an XRD spectrum of an insulating ceramic compact of sample No. 20 according to an example of the present invention.

In addition, the cylindrical sample was pulverized and was then analyzed by using an XRD (x-ray diffraction)

method, whereby the presence of an $MgAl_2O_4$ crystal phase, an $Mg_3B_2O_6$ crystal phase, an $Mg_2B_2O_5$ crystal phase and an $Mg_2SiO_4$ crystal phase were confirmed. The results are shown in Table 2 below. In Table 2, SP indicates an $MgAl_2O_4$ crystal phase, KO indicates an $Mg_3B_2O_6$ crystal phase, SU indicates an $Mg_2B_2O_5$ crystal phase and FO indicates an $Mg_2SiO_4$ crystal phase. WO indicates a $CaSiO_3$ crystal phase and GH indicates a $Ca_2Al(AlSiO_7)$ crystal phase. In addition, in FIGS. 1 to 3, analyzed results of the insulating ceramic compacts of sample No. 9, sample No. 14 and sample No. 20 by the XRD method are shown, respectively. In FIGS. 1 to 3, ○ indicates a peak in accordance with the $MgAl_2O_4$ crystal phase, Δ indicates a peak in accordance with the $Mg_3B_2O_6$ crystal phase, x indicates a peak in accordance with the $Mg_2B_2O_5$ crystal phase and ▽ indicates a peak in accordance with the $Mg_2SiO_4$ crystal phase.

In addition, bending strengths of additionally formed strip-shaped samples formed of the insulating ceramic compact were evaluated by a three-point bending test in accordance with JIS C2141. Sample No. 20 showed a high strength of 280 MPa.

Furthermore, using the strip-shaped samples used for the bending strength test, the coefficients of thermal expansion were measured. Coefficients of thermal expansion from room temperature to 600° C. are shown in Table 2 below.

TABLE 1

|   | $SiO_2$/wt % | $B_2O_3$/wt % | MgO/wt % | $Li_2O$/wt % | ZnO/wt % | CuO/wt % | $Al_2O_3$/wt % | CaO/wt % |
|---|---|---|---|---|---|---|---|---|
| A | 13.5 | 33.9 | 52.6 | — | — | — | — | — |
| B | 13.5 | 33.9 | 47.6 | 5 | — | — | — | — |
| C | 11.5 | 29 | 44.5 | 5 | 10 | — | — | — |
| D | 18.0 | 25.2 | 45.8 | 5 | 5 | 1 | — | — |
| E | 20 | 41 | 28 | 3 | 5 | 1 | 2 | — |
| F | 26 | 18 | 45 | 5 | 5 | 1 | — | — |
| G | 35 | 15 | 40 | 6 | 2 | 2 | — | — |
| H | 22 | 35 | 35 | 10 | 5 | 1 | 2 | — |
| I | 12 | 60 | 28 | — | — | — | 5 | — |
| J | 19.5 | 20 | 49.5 | 5 | 5 | 1 | — | — |
| K | 20 | 22 | 47 | 5 | 5 | 1 | — | — |
| L | 40 | 10 | 36 | 9 | 5 | — | — | — |
| M | 35 | 18 | 50 | 2 | — | — | — | — |
| N | 13.1 | 22.6 | 42.3 | 10 | 10 | — | 2 | — |
| O | 17.1 | 25.6 | 45.3 | 10 | — | — | 2 | — |
| P | 20 | 22 | 48 | 5 | 5 | — | — | — |
| Q | 38 | 9.5 | 28.5 | 5 | — | — | — | 19 |
| R | 40 | 5 | 10 | — | — | — | 10 | 35 |

TABLE 2

| No. | $MgAl_2O_4$ (wt. %) | Addition Amount of Glass (wt. %) | Type | Firing Temperature (° C.) | Crystal Phase | Coefficient of Thermal Expansion (ppm/° C.) | ε | Q @15 GHz |
|---|---|---|---|---|---|---|---|---|
| 1 | 20 | 80 | A | 920 | SP,SU | 9.3 | 7.3 | 3000 |
| 2 | 30 | 70 | A | 980 | SP,SU | 9.4 | 7.1 | 2500 |
| 3 | 30 | 70 | B | 950 | SP,SU | 10.2 | 7.2 | 2600 |
| 4 | 40 | 60 | B | 1000 | SP,SU | 9.9 | 7.1 | 2300 |
| 5 | 35 | 65 | C | 920 | SP,SU | 10.0 | 7.2 | 2100 |
| 6 | 35 | 65 | D | 900 | SP,SU | 10.2 | 7.1 | 2000 |
| 7 | 80 | 20 | E | 1000 | SP,SU | 9.7 | 7.0 | 1800 |
| 8 | 50 | 50 | E | 850 | SP,SU | 9.8 | 7.2 | 1600 |
| 9 | 40 | 60 | F | 900 | SP,SU,FO | 10.0 | 7.0 | 1500 |
| 10 | 35 | 65 | G | 1000 | SP,KO,FO | 9.0 | 6.8 | 800 |
| 11 | 60 | 40 | H | 900 | SP,SU | 11.3 | 7.2 | 3300 |
| 12 | 70 | 30 | H | 950 | SP,SU | 10.8 | 7.4 | 2500 |
| 13 | 50 | 50 | I | 1000 | SP,SU | 9.3 | 7.0 | 700 |
| 14 | 40 | 60 | J | 920 | SP,KO,FO | 9.5 | 7.0 | 2000 |
| 15 | 50 | 50 | J | 1000 | SP,KO,FO | 9.6 | 7.3 | 1800 |
| 16 | 40 | 60 | K | 920 | SP,SU,FO | 9.5 | 7.0 | 1900 |
| 17 | 60 | 40 | K | 1000 | SP,SU,FO | 9.7 | 7.4 | 1300 |
| 18 | 25 | 75 | L | 1000 | SP,KO | 9.2 | 7.5 | 800 |
| 19 | 35 | 65 | M | 950 | SP,KO,FO | 9.0 | 6.8 | 1000 |
| 20 | 25 | 75 | N | 870 | SP,KO | 9.8 | 7.0 | 2600 |
| 21 | 25 | 75 | O | 930 | SP,KO | 9.8 | 7.1 | 2700 |
| 22 | 40 | 60 | P | 960 | SP,SU,FO | 9.5 | 7.1 | 2000 |
| 23 | 18 | 82 | B | 920 | SP,SU | 10.5 | 7.5 | 600 |
| 24 | 82 | 18 | B | 1000 | SP,SU | — | — | — |
| 25 | 45 | 55 | Q | 900 | SP,FO,GH | 10.5 | 7.3 | 500 |
| 26 | 40 | 60 | R | 950 | SP,WO | 8.1 | 8.0 | 300 |

As can be seen in Table 2, sample Nos. 1 to 24 of the insulating compositions according to the example of the present invention confirmed that sintering could be performed at a lower temperature of from 850 to 1,000° C.; the relative dielectric constant was low, such as approximately 7; the coefficient of thermal coefficient from room temperature to 600° C. was high, such as 9 to 11.5 ppm/° C.; and the Q value at a measurement frequency of 15 GHz was high, such as 700 or more.

In contrast, when glass Q or glass R shown in Table 1 was used, an $MgAl_2O_4$ crystal phase and a $CaSiO_3$ crystal phase or an $MgAl_2O_4$ phase, an $Mg_2SiO_4$ phase, and a $Ca_2Al$ ($AlSiO_7$) phase as primary crystals, are precipitated, and hence, the Q value may be decreased in some cases. When the glass content was less then 20 wt %, densification could not be performed at 1,000° C. or less and when the content was 80 wt %, the Q value was decreased.

Next, examples of the structures of a ceramic multilayer substrate, a ceramic electronic device, and a laminated ceramic electronic device, which use the insulating ceramic compact of the present invention, will be described.

Figure 4:
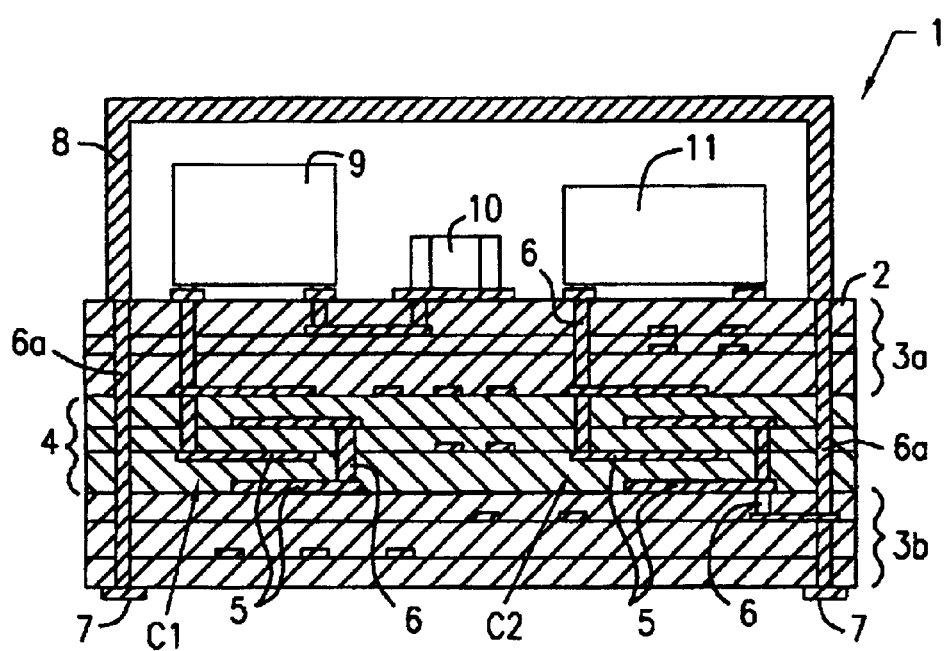
FIG. 4 is a cross-sectional view showing a laminated ceramic module as a ceramic electronic device using a ceramic multilayer substrate according to an example of the present invention.
Figure 5:
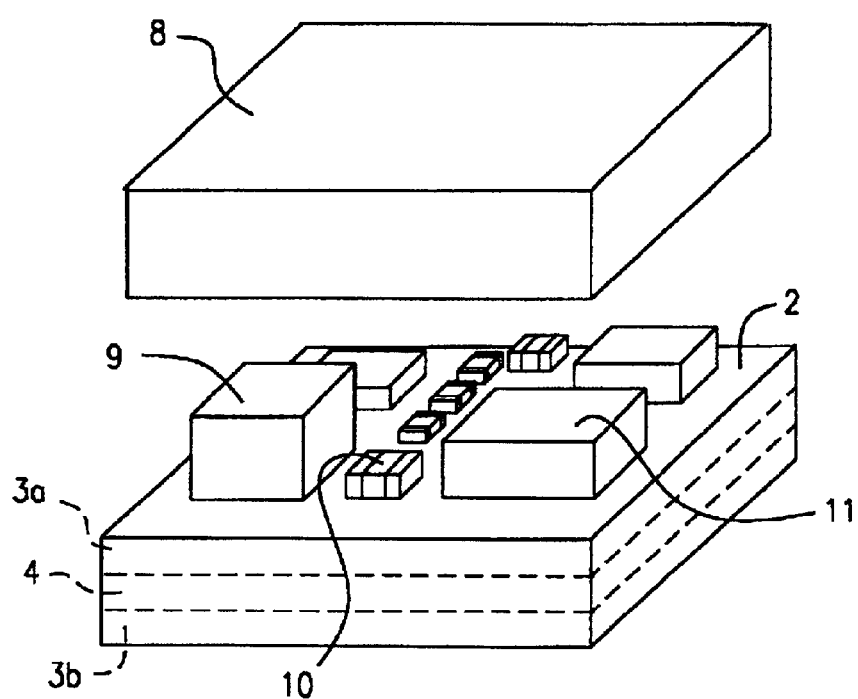
FIG. 5 is an exploded perspective view showing the ceramic multilayer module shown in FIG. 4.

FIG. 4 is a cross-sectional view showing a ceramic multilayer module as an example of a ceramic electronic device including the ceramic multilayer substrate according to the present invention, and FIG. 5 is an exploded perspective view thereof.

A ceramic multilayer module 1 is formed by using a ceramic multilayer substrate 2.

The ceramic multilayer substrate 2 comprises insulating ceramic layers 3a and 3b composed of the insulating ceramic compact of the present invention and dielectric ceramic layer 4, which has a high dielectric constant and which is composed of, for example, barium titanate mixed with glass, provided therebetween.

In the dielectric ceramic layer 4, a plurality of internal electrodes 5 are disposed so as to be adjacent to each other with parts of the dielectric ceramic layer 4 provided therebetween, and hence, laminated ceramic capacitors C1 and C2 are formed.

In addition, a plurality of via hole electrodes 6 and 6a and internal wires are provided for the insulating ceramic layers 3a and 3b and the dielectric ceramic layer 4.

Furthermore, on the upper surface of the ceramic multilayer substrate 2, electronic elements 9 to 11 are mounted. As the electronic elements 9 to 11, an electronic element, such as a semiconductor element, or a chip-type laminated capacitor, can be optionally used. By the via hole electrodes 6 and the internal wires, these electronic elements 9 to 11 and the capacitor units C1 and C2 are electrically connected to each other, whereby a circuit of the ceramic multilayer module 1 is formed.

In addition, on the upper surface of the ceramic multilayer substrate 2, a conductive cap 8 is fixed. The conductive cap 8 is electrically connected to via hole electrodes 6a penetrating the ceramic multilayer substrate 2 from the upper surface to the bottom surface thereof. External electrodes 7 are formed on the bottom surface of the ceramic multilayer substrate 2 and are connected to the via hole electrodes 6a. Even though other external electrodes are not shown in the figure, as is the case of the external electrodes 7, they are formed only on the bottom surface of the ceramic multilayer substrate 2. Furthermore, the other external electrodes are connected to the electronic elements 9 to 11 and the capacitor units C1 and C2 via the internal wires described above.

As described above, since the external electrodes 7, which are connected to the outside, are formed only on the bottom surface of the ceramic multilayer substrate 2, the ceramic multilayer module can be easily mounted by using the bottom surface thereof on the surface of a printed circuit board or the like.

In this example, since the cap 8 is composed of a conductive material and is connected to the external electrodes 7 via the via hole electrodes 6a, the electronic elements 9 to 11 can be electromagnetically shielded by the conductive cap 8.

However, the cap 8 is not necessarily formed of a conductive material. In the ceramic multilayer module 1 of this example, since the insulating ceramic layers 3a and 3b described above are formed of the insulating ceramic compact of the present invention, the dielectric constant is low and the Q value is also high, whereby a ceramic multilayer module 1 suitably used in high frequency regions can be provided. In addition, since the insulating ceramic layers 3a and 3b have a superior mechanical strength, a ceramic multilayer module 1 having a superior mechanical strength can be formed.

In this connection, the ceramic multilayer substrate 2 can be easily formed by a known integral firing technique for a laminated ceramic.

In the laminated capacitor units C1 and C2, since an insulating ceramic layer having a high dielectric constant is disposed between the internal electrodes 5 which are adjacent to each other in the thickness direction, a large static capacitance can be obtained by internal electrodes each having a relatively small surface area, and hence, miniaturization can also be performed.

Figure 6:
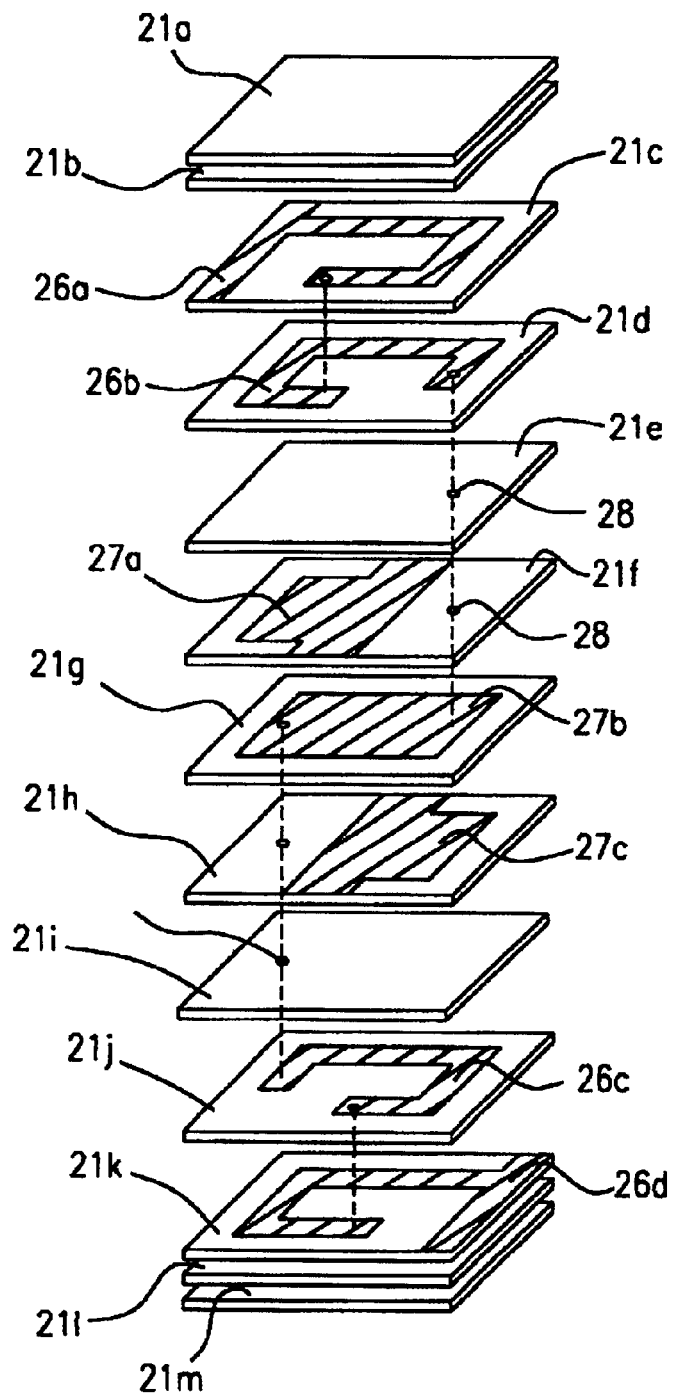
FIG. 6 is an exploded perspective view for illustrating ceramic green sheets and electrode patterns formed thereon, which are used for manufacturing a laminated ceramic electronic device according to an example of the present invention.
Figure 7:
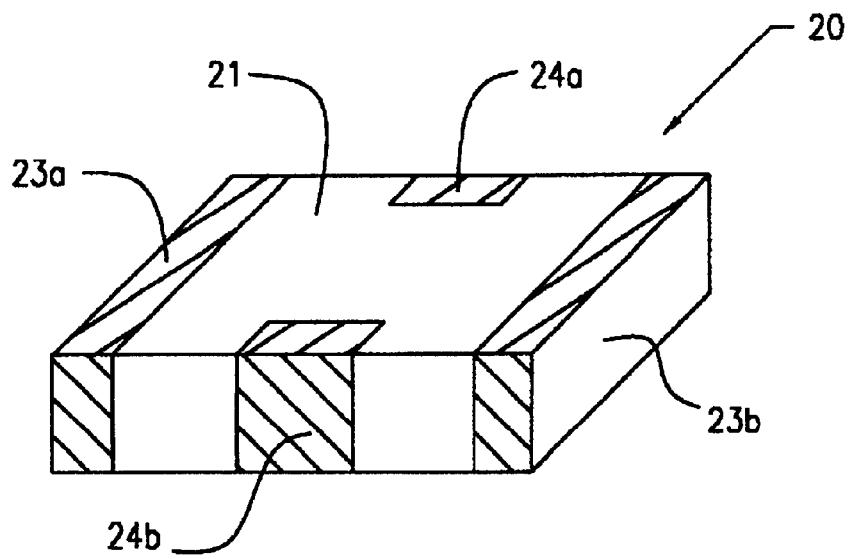
FIG. 7 is a perspective view showing a laminated ceramic electronic device according to an example of the present invention.
Figure 8:
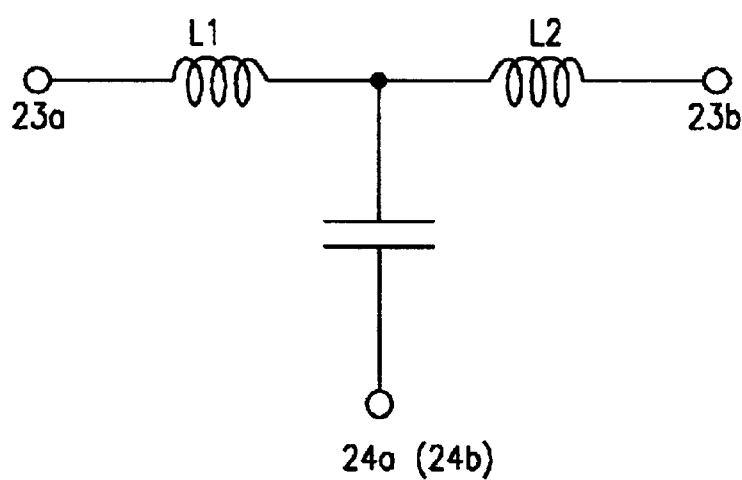
FIG. 8 is a diagram showing a circuit structure of the laminated ceramic electronic device shown in FIG. 7.

FIGS. 6 to 8 are an exploded perspective view, an outline perspective view and a circuit diagram, respectively, for illustrating the structure of a laminated ceramic electronic device according to a second example of the present invention.

The laminated ceramic electronic device 20 shown in FIG. 7 is an LC filter. In a sintered ceramic body 21, a circuit forming an inductance L and a static capacitance C is formed as described below. The sintered ceramic body 21 is formed of the insulating ceramic compact of the present invention. In addition, external electrodes 23a, 23b, 24a and 24b are formed on outside surfaces of the sintered ceramic body 21, and between the external electrodes 23a, 23b, 24a and 24b, an LC resonant circuit shown in FIG. 8 is formed.

Next, the inside structure of the sintered ceramic body 21 will be disclosed by describing a manufacturing method therefor with reference to FIG. 6.

First, an organic vehicle is added to the insulating ceramic compact of the present invention, thereby yielding a ceramic slurry. This ceramic slurry is processed by an optional sheet molding method, thereby forming ceramic green sheets. After the ceramic green sheets thus formed are dried, they are punched out into a predetermined size, whereby rectangular ceramic green sheets 21a to 21m are formed.

Next, throughholes for forming via hole electrodes 28 are formed in the ceramic green sheets 21a to 21m as required. By applying a conductive paste on the ceramic green sheets by screen printing, coil conductors 26a and 26b, capacitor internal electrodes 27a to 27c, and coil conductors 26c and 26d are formed, and in addition, the via hole electrodes 28 are formed by filling a conductive paste in the throughholes for via holes.

Subsequently, the ceramic green sheets 21a to 21m are laminated to each other in the direction shown in the figure and are then pressed in the thickness direction, thereby yielding a laminate.

The laminate thus formed is fired, whereby the sintered ceramic body 21 is obtained.

On the sintered ceramic body 21 thus obtained, the external electrodes 23a to 24b are formed as shown in FIG. 7 by a thin-film forming method, such as coating and baking of a conductive paste, deposition, plating or sputtering. As described above, the laminated ceramic electronic device 20 can be obtained.

As can be seen form FIG. 6, an inductance unit L1 is formed of the coil conductors 26a and 26b, an inductance unit L2 is formed of the coil conductors 26c and 26d, and a capacitor C is formed of the internal electrodes 27a to 27c, which are shown in FIG. 8.

In the laminated ceramic electronic device 20 of this example, the LC filter is formed as described above; however, since the sintered ceramic body 21 is formed of the insulating ceramic compact of the present invention, the LC filter can be obtained by low temperature firing as is the case of the ceramic multilayer substrate 2 in the example described above. Accordingly, the LC filter can be obtained by integral firing of the ceramic using a low melting point metal, such as copper, silver or gold, used as the internal electrodes, i.e., as the coil conductors 26a to 26c and the capacitor internal electrodes 27a to 27c. In addition, an LC filter can be formed which has a low relative dielectric constant and a high Q value at a high frequency and which is suitably used in a high frequency region. Furthermore, since the insulating ceramic compact described above has a superior mechanical strength, an LC filter having a superior mechanical strength can also be provided.

In the insulating ceramic compact in accordance with said one aspect of the present invention, which is a fired mixture of the $MgAl_2O_4$-based ceramic and the borosilicate glass, since the $MgAl_2O_4$ crystal phase and at least one of the $Mg_3B_2O_6$-based crystal phase and the $Mg_2B_2O_5$ crystal phase are precipitated as the primary crystal phases, the insulating ceramic compact can be obtained by firing at a low temperature of 1,000° C. or less. In addition, the Qxf value is high, such as 10,000 GHz or more at a measurement frequency of 10 GHz. Furthermore, the coefficient of thermal expansion is also high in the range of from room temperature to 600° C. Accordingly, a high-frequency insulating ceramic compact can be provided which is preferably used in high frequency regions, can be co-sintered with a high dielectric material having a high coefficient of thermal expansion, and can be sintered together with a low melting point metal such as copper or silver.

Consequently, an inexpensive ceramic multilayer substrate and a laminated ceramic electronic device can be provided which have a high Q value, have superior high frequency characteristics, and has a portion, composed of a high dielectric material, formed by integral firing by using the insulating ceramic compact in accordance with said one aspect of the present invention.

In the insulating ceramic compact in accordance with said another aspect of the present invention, which is the fired mixture of the $MgAl_2O_4$-based ceramic and the borosilicate glass, since the $MgAl_2O_4$ crystal phase and at least one of the $Mg_2SiO_4$-based crystal phase, the $Mg_3B_2O_6$-based crystal phase, and the $Mg_2B_2O_5$ crystal phase are precipitated as the primary crystal phases, an insulating ceramic compact can be provided which can be obtained by firing at a low temperature, such as 1,000° C. or less, and which has a high Q value and a superior mechanical strength. Accordingly, the insulating ceramic compact can be co-sintered with an inexpensive metal having a low resistance, such as Cu or Ag, and hence, the metals mentioned above can be used as an internal electrode material for use in ceramic multilayer substrates or laminated ceramic electronic devices. As a result, an inexpensive ceramic multilayer substrate and a laminated ceramic electronic device can be provided having a high mechanical strength and a high Q value.

In the case in which the borosilicate glass contains boron oxide, silicon oxide, magnesium oxide and an alkali metal oxide, when the $MgAl_2O_4$ crystal phase and at least one of the $Mg_3B_2O_6$-based crystal phase and the $Mg_2B_2O_5$ crystal phase, or the $MgAl_2O_4$ crystal phase and at least one of the $Mg_2SiO_4$-based crystal phase, the $Mg_3B_2O_6$-based crystal phase, and the $Mg_2B_2O_5$ crystal phase are precipitated as the primary crystal phase and when the borosilicate glass contains an alkali metal oxide in the predetermined ratio described above, the insulating ceramic compact according to the present invention can be obtained by firing at an even lower temperature without decreasing the Q value.

When the borosilicate glass described above contains boron oxide, silicon oxide, magnesium oxide and an alkali metal oxide in the predetermined ratios described above, an insulating ceramic compact can be more stably provided which can be obtained by low-temperature firing at 1,000° C. or less and has a high Q value.

When the borosilicate glass described above contains about 20 wt % or less of an alkali metal oxide, the insulating ceramic compact according to the present invention can be more stably obtained by low-temperature firing at 1,000° C. or less.

When the borosilicate glass described above contains about 20 wt % or less of aluminum oxide, the chemical stability of the borosilicate glass can be improved, and the insulating ceramic compact according to the present invention can be more stably obtained by low-temperature firing at 1,000° C. or less.

When the borosilicate glass described above contains about 30 wt % or less of zinc oxide, the melting temperature of the glass is decreased, and hence, an insulating ceramic compact can be obtained by firing at an even lower temperature.

When the borosilicate glass described above contains about 10 wt % or less of copper oxide, the insulating ceramic compact according to the present invention can be obtained by firing at an even lower temperature without decreasing the Q value.

When the ratio of the $MgAl_2O_4$-based ceramic to the borosilicate glass is in the range of from about 20:80 to 80:20 on a weight basis, an insulating ceramic compact can be provided which has a high Q value and which can be satisfactory densified by low-temperature firing at 1,000° C. or less.

In the present invention, when in the insulating ceramic compact, about 5 to 80 wt % of the $MgAl_2O_4$ crystal phase and 5 to 70 wt % of at least one of the $Mg_3B_2O_6$ crystal phase and the $Mg_2B_2O_5$ crystal phase are precipitated, respectively, an insulating ceramic compact having preferable sintering characteristics and superior reliability can be provided.

Since the ceramic multilayer substrate of the present invention comprises a ceramic board containing insulating ceramic layers composed of the insulating ceramic compact of the present invention, the ceramic multilayer substrate can be fired at a low temperature and an inexpensive metal, such as Ag or Cu, having a low resistance can be used as an internal electrode material. In addition, since the insulating ceramic layer has a high mechanical strength and a high Q value, a ceramic multilayer substrate can be provided which is preferably used in high-frequency regions.

Concerning the structures described in the examples, the ceramic multilayer module 1 and the laminated ceramic electronic device 20 forming the LC filter are described by way of example; however, the ceramic electronic device and the ceramic multilayer electronic device of the present invention are not limited to the structures described above. That is, the present invention can be applied to various ceramic multilayer substrates such as a ceramic multilayer substrate for a multi-chip module or a ceramic multilayer substrate for a hybrid IC; various ceramic electronic devices having electronic elements mounted on the ceramic multilayer substrates described above; and various chip-type laminated electronic devices such as a chip-type laminated capacitor or a chip-type laminated dielectric antenna.

In the ceramic multilayer substrate, when on at least one surface of the insulating ceramic layers, a second ceramic layer having a dielectric constant higher than that of the insulating ceramic layers is provided, by designing the composition and laminating mode of the second ceramic layer, the strength and the characteristics against environment can be optionally adjusted in accordance with various requirements.

When a laminated ceramic capacitor is formed by laminating a plurality of internal electrodes to each other with at least a part of the insulating ceramic layers provided therebetween, the insulating ceramic compact of the present invention has a low dielectric constant and a high Q value, and hence, the laminated ceramic capacitor can be preferably used in high frequency regions.

In addition, since the insulating ceramic compact of the present invention has a high mechanical strength, a laminated capacitor having a superior mechanical strength can be formed.

When the plurality of internal electrodes comprises internal electrodes for forming a laminated capacitor and a plurality of coil conductors connected to each other for forming a laminated inductor, since the insulating ceramic compact of the present invention has a low dielectric constant, a high Q value at a high frequency and a high mechanical strength, a compact LC resonant circuit preferably used in high frequency regions can be easily formed.

According to the ceramic electronic device of the present invention formed by laminating at least one electronic element to the ceramic multilayer substrate of the present invention, by using the electronic element and a circuit structure formed in the ceramic multilayer substrate, various compact ceramic electronic devices preferably used in high frequency regions can be provided.

When a cap is fixed to the ceramic multilayer substrate so as to enclose the electronic element, the electronic element can be protected by the cap and a ceramic electronic device having a superior humidity resistance and the like can be provided.

When a conductive cap is used as the cap, electromagnetic shield can be performed for the electronic element enclosed by the cap.

When external electrodes are formed only on the bottom surface of the ceramic multilayer substrate, the ceramic multilayer substrate can be easily surface-mounted at the bottom surface side thereof on a printed circuit board or the like.

In the laminated ceramic electronic device of the present invention, since a plurality of internal electrodes is formed in the insulating ceramic compact of the present invention, firing can be performed at a low temperature and an inexpensive metal, such as Ag or Cu, having a low resistance can be used as an internal electrode material. In addition, since the insulating ceramic compact has a low dielectric constant and a high Q value, and is preferably used in high frequency regions, a laminated capacitor preferably used in high frequency regions can be provided. Furthermore, since the insulating ceramic compact has a high mechanical strength, a laminated capacitor having a superior mechanical strength can be formed.

In the laminated ceramic electronic device of the present invention, when a plurality of internal electrodes forms a laminated capacitor, since the insulating ceramic compact of the present invention has a low dielectric constant and a high Q value, the laminated capacitor is preferably used in high frequency regions.

In the laminated ceramic electronic device of the present invention, when a plurality of internal electrodes comprises internal electrodes for forming a laminated capacitor and coil conductors for forming a laminated inductor, since the insulating ceramic compact of the present invention has a superior mechanical strength, has a low dielectric constant as described above and a high Q value at a high frequency, a compact LC resonant circuit can be formed which has a high mechanical strength and which is preferably used in high frequency regions.

What is claimed is:

1. An insulating ceramic compact comprising a fired mixture of $MgAl_2O_4$-based ceramic and borosilicate glass, wherein the glass fired compact comprises an $MgAl_2O_4$ crystal phase and at least one of an $Mg_3B_2O_6$ crystal phase and an $Mg_2B_2O_5$ crystal phase.

2. An insulating ceramic compact according to claim 1, wherein the glass fired compact further comprises an $Mg_2SiO_4$ crystal phase.

3. An insulating ceramic compact according to claim 2, wherein the borosilicate glass comprises about 8 to 60 wt % of boron oxide calculated as $B_2O_3$, about 10 to 50 wt % of silicon oxide calculated as $SiO_2$ and about 10 to 55 wt % of magnesium oxide calculated as MgO.

4. An insulating ceramic compact according to claim 3, wherein the borosilicate glass comprises about 20 to 40 wt % of boron oxide calculated as $B_2O_3$, about 13 to 38 wt % of silicon oxide calculated as $SiO_2$ and about 35 to 53 wt % of magnesium oxide calculated as MgO.

5. An insulating ceramic compact according to claim 4, wherein the borosilicate glass comprises about 20 wt % or less of alkali metal oxide, about 20 wt % or less of aluminum oxide, about 30 wt % or less of zinc oxide, and about 10 wt % or less of copper oxide.

6. An insulating ceramic compact according to claim 2, wherein the ratio of the $MgAl_2O_4$-based ceramic to the borosilicate glass is in the range of from about 20:80 to 80:20 on a weight basis.

7. An insulating ceramic compact according to claim 2, wherein the glass fired compact contains about 5 to 80 wt % of the $MgAl_2O_4$ and about 5 to 70 wt % of the at least one of $Mg_3B_2O_6$ and $Mg_2B_2O_5$, based on the total amount of the $Mg_2SiO_4$, $Mg_3B_2O_6$ and $Mg_2B_2O_5$ crystal phases.

8. An insulating ceramic compact according to claim 7, wherein the ratio of the $MgAl_2O_4$-based ceramic to the borosilicate glass is in the range of from about 20:80 to 80:20 on a weight basis, the borosilicate glass comprises about 20 to 40 wt % of boron oxide calculated as $B_2O_3$, about 13 to 38 wt % of silicon oxide calculated as $SiO_2$ and about 35 to 53 wt % of magnesium oxide calculated as MgO, and wherein the borosilicate glass comprises about 20 wt % or less of alkali metal oxide, about 20 wt % or less of aluminum oxide, about 30 wt % or less of zinc oxide, and about 10 wt % or less of copper oxide.

9. An insulating ceramic compact according to claim 1, wherein the borosilicate glass comprises about 8 to 60 wt % of boron oxide calculated as $B_2O_3$, about 10 to 50 wt % of silicon oxide calculated as $SiO_2$ and about 10 to 55 wt % of magnesium oxide calculated as MgO.

10. An insulating ceramic compact according to claim 9, wherein the borosilicate glass comprises about 20 to 40 wt % of boron oxide calculated as $B_2O_3$, about 13 to 38 wt % of silicon oxide calculated as $SiO_2$ and about 35 to 53 wt % of magnesium oxide calculated as MgO.

11. An insulating ceramic compact according to claim 10, wherein the borosilicate glass comprises about 20 wt % or less of alkali metal oxide, about 20 wt % or less of aluminum oxide, about 30 wt % or less of zinc oxide, and about 10 wt % or less of copper oxide.

12. An insulating ceramic compact according to claim 1, wherein the ratio of the $MgAl_2O_4$-based ceramic to the borosilicate glass is in the range of from about 20:80 to 80:20 on a weight basis.

13. An insulating ceramic compact according to claim 1, wherein the fired compact contains about 5 to 80 wt % of the $MgAl_2O_4$ and about 5 to 70 wt % of the at least one of $Mg_3B_2O_6$ and $Mg_2B_2O_5$, based on the total amount of the $Mg_2SiO_4$, $Mg_3B_2O_6$ and $Mg_2B_2O_5$ crystal phases.

14. An insulating ceramic compact according to claim 13, wherein the ratio of the $MgAl_2O_4$-based ceramic to the borosilicate glass is in the range of from about 20:80 to 80:20 on a weight basis, the borosilicate glass comprises about 20 to 40 wt % of boron oxide calculated as $B_2O_3$, about 13 to 38 wt % of silicon oxide calculated as $SiO_2$ and about 35 to 53 wt % of magnesium oxide calculated as MgO, and wherein the borosilicate glass comprises about 20 wt % or less of alkali metal oxide, about 20 wt % or less of aluminum oxide, about 30 wt % or less of zinc oxide, and about 10 wt % or less of copper oxide.

15. A ceramic multilayer substrate comprising:
- a plurality of insulating ceramic layers comprising an insulating ceramic compact according to claim 1; and
- a plurality of internal electrodes on the plurality of insulating ceramic layers.

16. A ceramic multilayer substrate according to claim 15, having on at least one surface of each of the insulating ceramic layers, a second ceramic layer which has a dielectric constant higher than that of the insulating ceramic layer on which it is disposed.

17. A ceramic multilayer substrate according to claim 15, wherein a pair of the internal electrodes and at least a part of a insulating ceramic layer form a laminated capacitor.

18. A ceramic multilayer substrate according to claim 17, wherein a plurality of internal electrodes form a coil conductor, whereby a laminated inductor has been formed.

19. A ceramic electronic device comprising:
- a ceramic multilayer substrate according to claim 15; and
- at least one electronic element mounted on the ceramic multilayer substrate so as to form a circuit together with the plurality of internal electrodes.

20. A ceramic electronic device according to claim 19, further comprising:
- a plurality of external electrodes on the bottom surface of the ceramic multilayer substrate; and
- wherein the substrate contains throughholes having conductors therein, the conductors electrically connecting an external electrode to an internal electrode or to the electronic element.

* * * * *